US005521564A

United States Patent [19]

Kaneko et al.

[11] Patent Number: 5,521,564

[45] Date of Patent: May 28, 1996

[54] RESONATOR AND CHIP-TYPE FILTER USING IT

[75] Inventors: Toshimi Kaneko; Masahiko Kawaguchi; Katsuji Matsuta, all of Nagaokakyo, Japan

[73] Assignee: Murata Manufacturing Co., Ltd., Japan

[21] Appl. No.: 294,445

[22] Filed: Aug. 23, 1994

[30] Foreign Application Priority Data

Aug. 25, 1993 [JP] Japan .................................... 5-234037

[51] Int. Cl.$^6$ ....................................................... H03H 7/00

[52] U.S. Cl. ........................... 333/175; 333/185; 333/202

[58] Field of Search .................................... 333/202, 204, 333/175, 185, 219, 222, 246; 336/200

[56] References Cited

U.S. PATENT DOCUMENTS 5,357,227 10/1994 Tonegawa et al. ..................... 333/185

5,376,908 12/1994 Kawaguchi et al. .................... 333/203

FOREIGN PATENT DOCUMENTS 6104 1/1994 Japan ..................................... 333/204

*Primary Examiner*—Benny Lee

*Assistant Examiner*—David H. Vu

*Attorney, Agent, or Firm*—Ostrolenk, Faber, Gerb & Soffen

[57] ABSTRACT

A resonator comprises two dielectric substrates. A ground electrode and a U-shaped pattern electrode are formed respectively on the two surfaces of the first dielectric substrate. A take-out electrode is drawn out at a certain distance from one end of the pattern electrode, and is connected to the take-out terminal electrode. A guard electrode is formed opposite to the other end of the pattern electrode. A shield electrode is formed on a second dielectric substrate. The pattern electrode, the ground electrode and the shield electrode are connected by a terminal electrode. In addition, the guard electrode, the ground electrode and the shield electrode are connected by a terminal electrode. A chip-type filter can be obtained by forming a plurality of pattern electrodes on an dielectric substrate, and coupling them electromagnetically.

10 Claims, 23 Drawing Sheets

50

RESONATOR AND CHIP-TYPE FILTER USING IT

BACKGROUND OF THE INVENTION

1. Field of the Invention

The present invention relates to a resonator and a chip-type filter using it, in particularly, to a ¼-wavelength resonator and a chip-type filter using it.

2. Description of the Prior Art

FIG. 36 shows a perspective view of one example of an existing resonator that forms the background to this invention. The resonator comprises a dielectric substrate 1, and a ground electrode 2 is formed over almost all of one surface of it. On the other surface of the dielectric substrate 1, a linear pattern electrode 3 is formed so as to be opposite to the ground electrode 2. One end of the pattern electrode 3 is connected to the ground electrode 2 through an edge of the dielectric substrate 1. A microstrip line is formed by the dielectric substrate 1, the ground electrode 2 and the pattern electrode 3.

In addition, using this type of resonator, a chip-type filter is formed as shown in FIG. 37. In the chip-type filter, a ground electrode 2 is formed over almost all of one surface of the dielectric substrate 1. On the other surface of the dielectric substrate 1, two pattern electrodes 3 are formed so as to be opposite to the ground electrode 2. One end of each pattern electrode 3 is connected to the ground electrode 2 through one edge of the dielectric substrate 1. These pattern electrodes 3 are formed so as to be parallel to each other, and are electromagnetically coupled. A take-out electrode 4 is formed from each pattern electrode 3 toward an edge of the dielectric substrate 1. The take-out electrode 4 is formed so as to be separated at a certain distance from one end of the pattern electrode 3 that is connected to the ground electrode 2. In the chip-type filter, the filter is formed by the electromagnetic coupling of two microstrip lines.

In this type of resonator and chip-type filter, one end of the pattern electrode is connected to the ground electrode, and the other end of the pattern electrode is open. These resonators and chip-type filters are formed by forming many electrodes on a large dielectric substrate, then cutting the dielectric substrate and finally connecting the pattern electrodes to the ground electrodes. However, since the pattern electrodes and the ground electrodes are formed on both surfaces of the dielectric substrate, displacement of the positions where the dielectric substrate is cut from the correct positions can cause fluctuation in the distances between the open ends of the pattern electrodes and the ground electrodes, causing the capacitance between the pattern electrodes and the ground electrodes to vary so that the characteristics of the resonators and the chip-type filters will fluctuate.

When the resonator is used, it is desirable for the impedance to be matched to the external circuit. However, in the microstrip line resonator shown in FIG. 36, since the characteristic impedance is determined by the dielectric constant and dimensions of the dielectric substrate and the dimensions of the electrodes, there are cases in which matching to the external circuit is impossible. For this reason, it becomes necessary to match the impedance to the external circuit by such means as connecting LC components for impedance matching and inserting a trimming step.

SUMMARY OF THE INVENTION

Therefore, the main purpose of this invention is to provide a resonator and a chip-type filter using it that will reduce the fluctuation of characteristics and make it possible to easily adjust impedances at the time of manufacture.

The resonator of this invention comprises a dielectric substrate, a ground electrode formed in a planar shape on one surface of the dielectric substrate, a pattern electrode formed on the other surface of the dielectric substrate so as to be opposed to the ground electrode and having one end connected to the ground electrode, a take-out electrode drawn out from the pattern electrode at a certain distance from one end of the pattern electrode, and a guard electrode formed on the other surface of the dielectric substrate at a position opposite to the other end of the pattern electrode and connected to the ground electrode.

The chip-type filter of this invention comprises a dielectric substrate, a ground electrode formed in a planar shape on one surface of the dielectric substrate, a plurality of pattern electrodes formed on the other surface of the dielectric substrate so as to be opposite to the ground electrode and each having one end connected to the ground electrode, take-out electrodes formed respectively at a certain distance from one end of each of the pattern electrodes and drawn out from the pattern electrodes, and a guard electrode formed on the other surface of the dielectric substrate at a position opposite to the other end of the respective pattern electrodes and connected to the ground electrodes, wherein the pattern electrodes are electromagnetically coupled.

In this type of chip-type filter, protective layers are formed on the ground electrode, and on the pattern electrodes, the take-out electrodes and the guard electrode.

A shield electrode may be formed so as to be opposed to the pattern electrode, the take-out electrodes and the guard electrodes with another dielectric substrate between these electrodes and the shield electrode. It is desirable to insulate the shield electrode from the other electrodes.

Since the open end of the pattern electrode and the guard electrode opposite it are formed on the same surface of the dielectric substrate, even if a dielectric substrate on which many electrodes are formed is cut, there is little fluctuation in the distances between the pattern electrodes and the corresponding guard electrodes. Since the guard electrodes are connected to the ground electrodes, there is little fluctuation in the capacitances formed between the pattern electrodes and the corresponding guard electrodes, that is to say, in the capacitances formed between the pattern electrodes and the ground electrodes. The impedance is determined by the distance between the end of the pattern electrode connected to the ground electrode, and the corresponding take-out electrode.

According to this invention, by forming the guard electrode, the fluctuation in the capacitance between the open end of the pattern electrode and the guard electrode is reduced, making it possible to reduce the fluctuation in the characteristics of the resonators and the chip-type filters. The impedances of the resonator and the chip-type filter can be adjusted by adjusting the distance between the end of the pattern electrode connected to the ground electrode and the take-out electrode. Consequently, it is possible to obtain the desired impedance, and the impedance can be matched to an external circuit, so it is not necessary to use other LC components. Moreover, it is possible to use a method such as etching to form the dimensions of the various electrodes accurately, so that highly accurate resonators and chip-type filters can be obtained. Since it is possible to accurately form a plurality of electrode patterns on one dielectric substrate, it is possible to mass produce resonators and chip-type filters, and the manufacturing cost can be reduced.

The above-described purpose of this invention, other purposes, characteristics, various features of it and its advantages will become even clearer from the description of embodiments given below with reference to the drawings.

DESCRIPTION OF THE PREFERRED EMBODIMENTS

Figure 1:
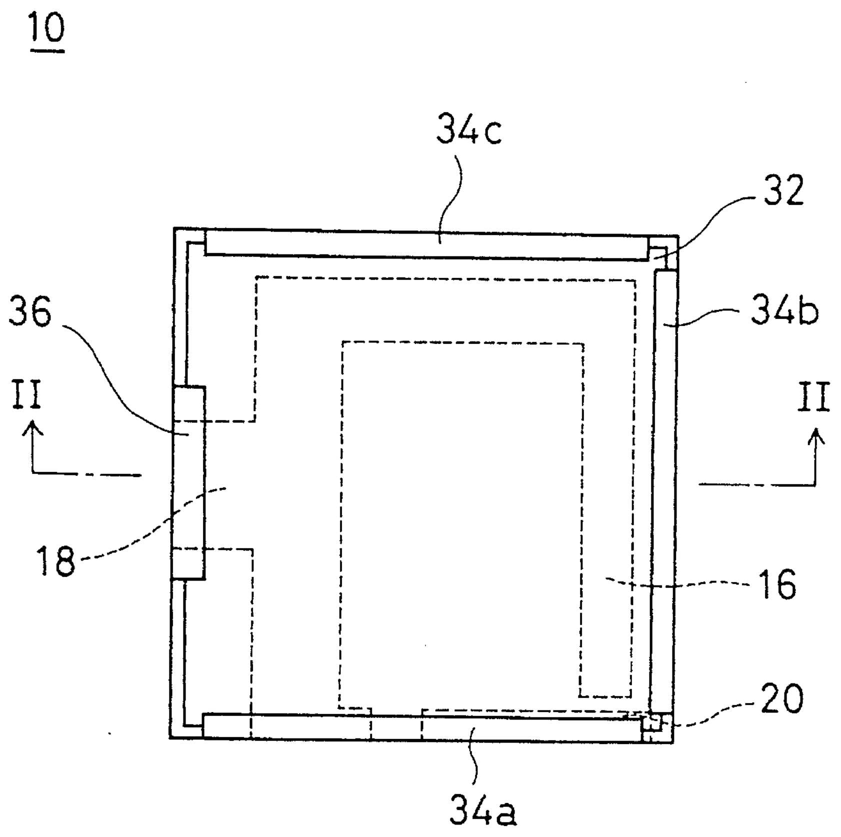
FIG. 1 is a perspective view which shows one example of the resonator of this invention.
Figure 2:
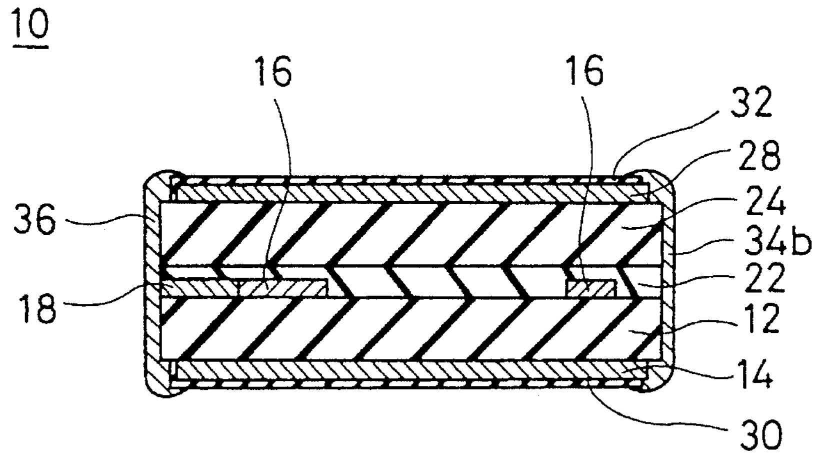
FIG. 2 is a cross-sectional view of the resonator shown in FIG. 1.
Figure 3:
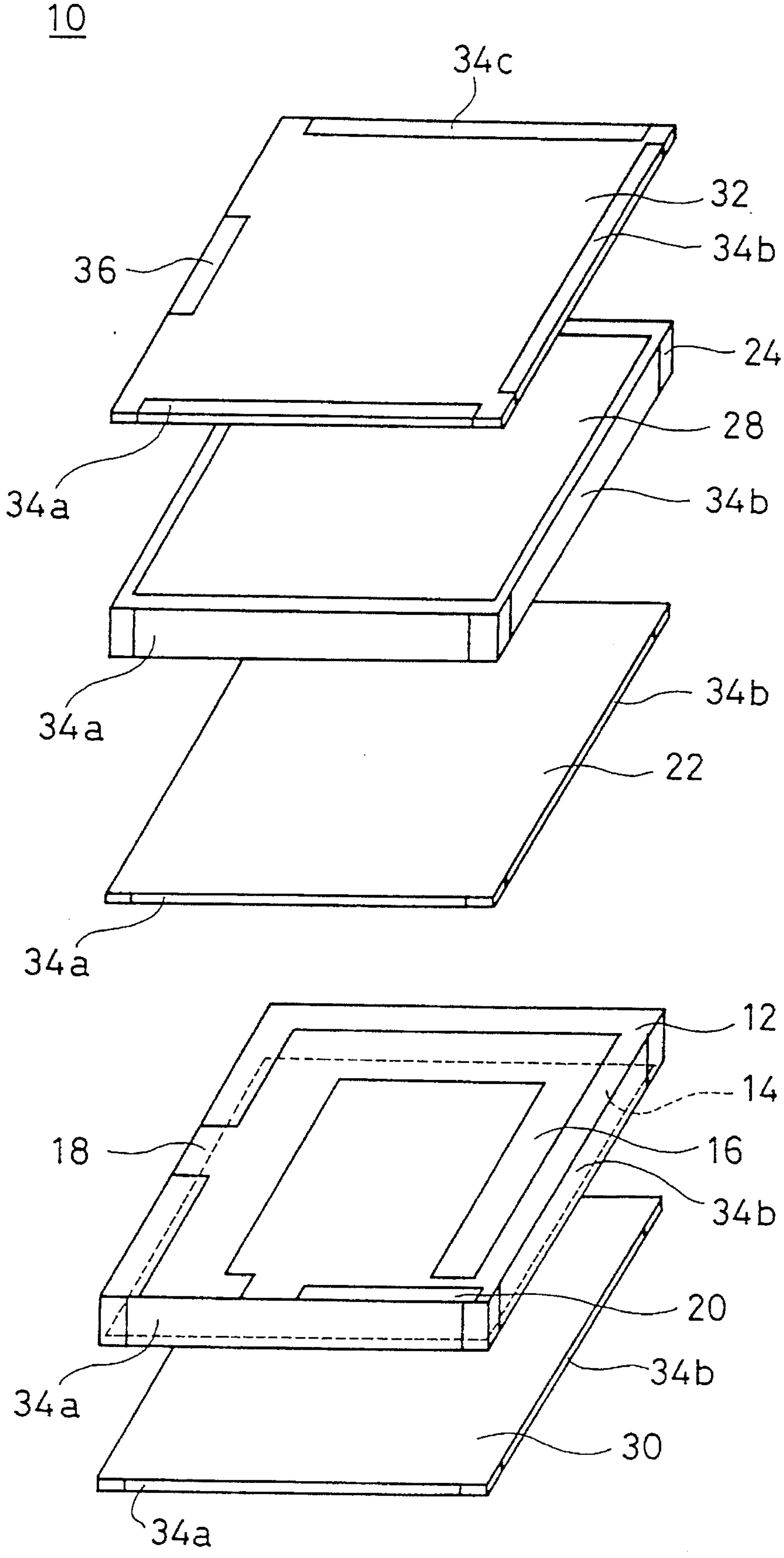
FIG. 3 is an exploded perspective view of the resonator shown in FIG. 1.
Figure 4:
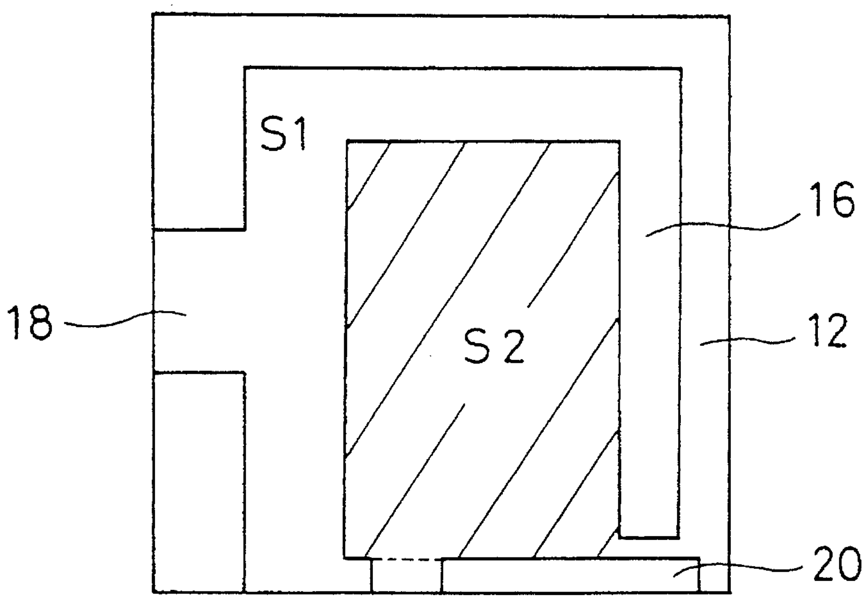
FIG. 4 is a plan view showing the first dielectric substrate of the resonator shown in FIG. 1.
Figure 5:
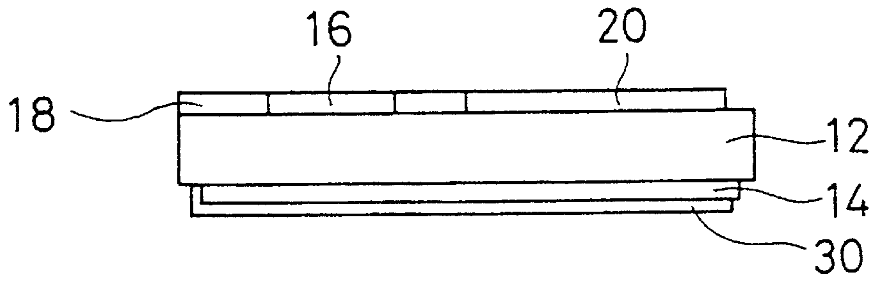
FIG. 5 is a side view of the first dielectric substrate shown in FIG. 4.
Figure 6:
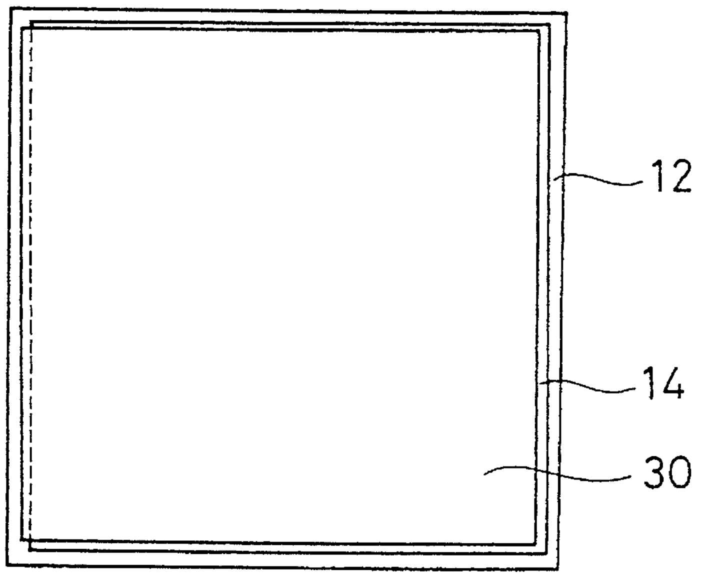
FIG. 6 is a rear view of a first dielectric substrate shown in FIG. 4.

FIG. 1 is a plan view showing one embodiment of this invention. FIG. 2 is a cross-sectional view along line II—II, and FIG. 3 is an exploded perspective view. The resonator 10 includes a first dielectric substrate 12. The first dielectric substrate 12 is formed in a rectangular shape from, for example, a dielectric ceramics. As the material of this first dielectric substrate 12, for example, the material having a dielectric constant of 70 or more is used. A ground electrode 14 is formed on one surface of the first dielectric substrate 12 so that it covers nearly the whole surface as shown in FIG. 4, FIG. 5 and FIG. 6. A pattern electrode 16 is formed in a U-shape on the other surface of the first dielectric substrate 12. One end of the pattern electrode 16 is pulled out to the edge of the first dielectric substrate 12. The pattern electrode 16 is formed so that its width becomes smaller from one end of it toward the other. A take-out electrode 18 is drawn out from the pattern electrode 16 toward the edge of the first dielectric substrate 12. The take-out electrode 18 is formed so that it is at a certain distance from one end of the pattern electrode 16 which is drawn out to the edge of the first dielectric substrate 12. Also, on the other surface of the first dielectric substrate 12, a guard electrode 20 is formed so that it is opposite to the other end of the pattern electrode 16. The guard electrode 20 is drawn out to an edge of the first dielectric substrate 12.

Figure 7:
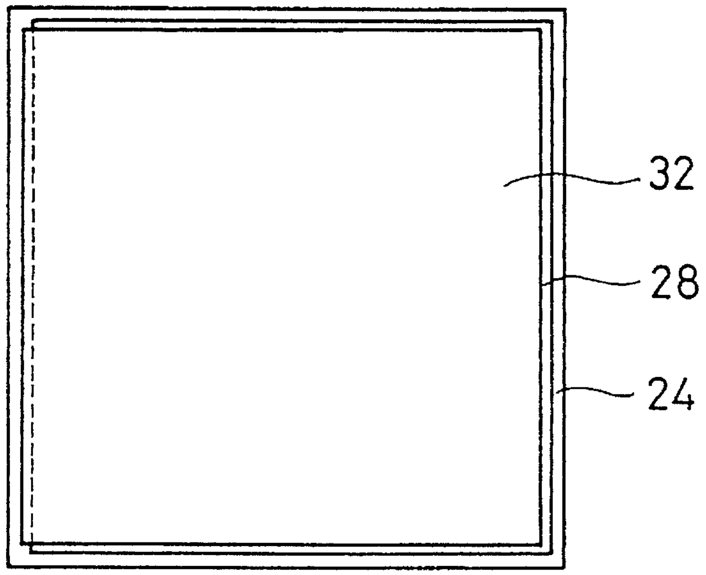
FIG. 7 is a plan view showing a second dielectric substrate of the resonator shown in FIG. 1.
Figure 8:
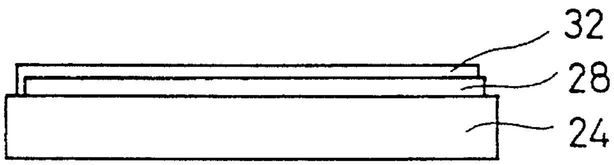
FIG. 8 is a side view of the second dielectric substrate shown in FIG. 7.
Figure 9:
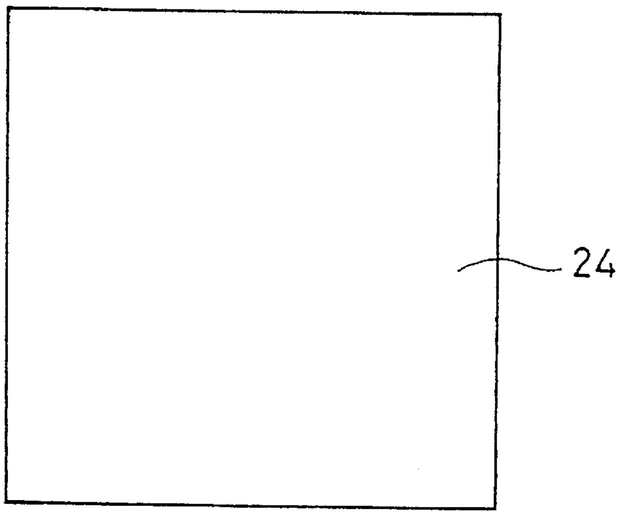
FIG. 9 is a rear view of the second dielectric substrate shown in FIG. 7.

An adhesive layer 22 consisting of, for example, polyimide is formed on the pattern electrode 16, the take-out electrode 18 and the guard electrode 20. A second dielectric substrate 24 is formed on the adhesive layer 22. As the second dielectric substrate 24, for example, the dielectric substrate having a lower dielectric constant than the first dielectric substrate 12 is used. The second dielectric substrate 24 is shown in FIG. 7, FIG. 8 and FIG. 9. A shield electrode 28 is formed over almost the whole surface of the second dielectric substrate 24. Protective layers 30 and 32 are formed so as to cover the ground electrode 14 and the shield electrode 28. At this time, the protective layers 30 and 32 are formed so that both ends of the ground electrode 14 and the shield electrode 28 are exposed except in the direction in which the take-out electrode 18 is drawn out.

Three terminal electrodes 34*a*, 34*b* and 34*c* are formed on three sides of the resonator 10. The terminal electrodes 34*a*, 34*b* and 34*c* are formed on the side on which the take-out electrode 18 is not drawn out. The pattern electrode 16, the ground electrode 14 and the shield electrode 28 are connected by the one terminal electrode 34*a*. The guard electrode 20 is connected to the terminal electrode 34*a*. The terminal electrodes 34*b* and 34*c* are connected to the ground electrode 14 and the shield electrode 28 respectively. On the side of the resonator 10 on which the take-out electrode 18 is drawn out, the take-out terminal electrode 36 is formed. The take-out terminal electrode 36 is connected to the take-out electrode 18. The impedance of the resonator 10 is determined by the distance between the end of the pattern electrode 16 that is connected to the terminal electrode 34*a* and the take-out electrode 18.

If the resonator 10 has a wavelength λ, effective dielectric constant $\epsilon_{re}$ and correction factor k, the length of the pattern electrode 16 is given by equation (1) below. The effective dielectric constant $\epsilon_{re}$ is given by equation (2) and equation (3).

$$L = \frac{k\lambda}{4\sqrt{\epsilon_{re}}} \qquad \text{Equation (1)}$$

$$\epsilon_{re} = \frac{\epsilon_r + 1}{2} + \frac{\epsilon_r - 1}{2}\left\{\left(1 + 12\frac{t}{W}\right)^{-1/2} + \frac{1}{25}\left(1 - \frac{W}{t}\right)^2\right\} \qquad \text{Equation (2)}$$

$$\epsilon_{re} = \frac{\epsilon_r + 1}{2} + \frac{\epsilon_r - 1}{2}\left(1 + 12\frac{t}{W}\right)^{-1/2} \quad (\text{when } W/t > 1) \qquad \text{Equation (3)}$$

Here, $\epsilon_r$ is the dielectric constant of the first dielectric substrate 12, W is the width of the pattern electrode 16, t is the thickness of the first dielectric substrate 12, and the correction factor k is a value corresponding to the number of times the pattern electrode 16 is bent, the dielectric constant of the second dielectric substrate 24 and the capacitance formed between the open end of the pattern electrode 16 and the guard electrode 20.

In manufacturing the resonator 10, the first dielectric substrate 12 is prepared. The ground electrode 14, the pattern electrode 16, the take-out electrode 18 and the guard electrode 20 are formed on the first dielectric substrate 12 by, for example, using thin film technology and etching. The shield electrode 28 is formed on the second dielectric substrate 24 by thin film technology. Then, glass or resin is used to form the protective layers 30 and 32 on the top of the ground electrode 14 on the first dielectric substrate 12 and the shield electrode 28 on the second dielectric substrate 24. Then, thermoplastic polyimide is deposited, printed or painted on the formed surface of the pattern electrode 16 on the first dielectric substrate 12, pressed against the second dielectric substrate 24 and heat and pressure are applied so that they will adhere. Then, the terminal electrodes 34*a*, 34*b* and 34*c* and the take-out terminal electrode 36 are formed to complete the resonator 10. This type of resonator can be mass produced by forming pattern electrodes, take-out electrodes and ground electrodes on one sheet of dielectric substrate, and then cutting the dielectric substrate.

Figure 10:
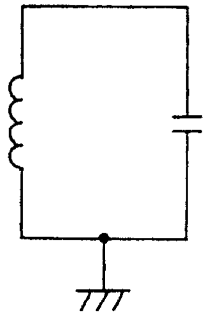
FIG. 10 is an equivalent circuit diagram of the resonator shown in FIG. 1.

A capacitor pattern is not formed in this resonator 10, but the resonator has an equivalent circuit shown in FIG. 10. Since the resonator 10 has a strip line construction, a capacitance is formed between the pattern electrode 16 and the ground electrode 14. A capacitance is also formed between the pattern electrode 16 and the shield electrode 28, but principally large part of capacitance is formed with the ground electrode 14 through the first dielectric substrate 12 which has large dielectric constant. The capacitance can be varied by varying the thickness of the first dielectric substrate 12, making it possible to vary the resonant frequency. The capacitance can also be varied by varying the dielectric constant of the first dielectric substrate 12 and the width of the pattern electrode 16. The frequency of the resonator 10 can be varied in the range 2 GHz to 6 GHz by varying the dielectric constant and thickness of the first dielectric substrate 12 and the area of the pattern electrode.

Figure 11:
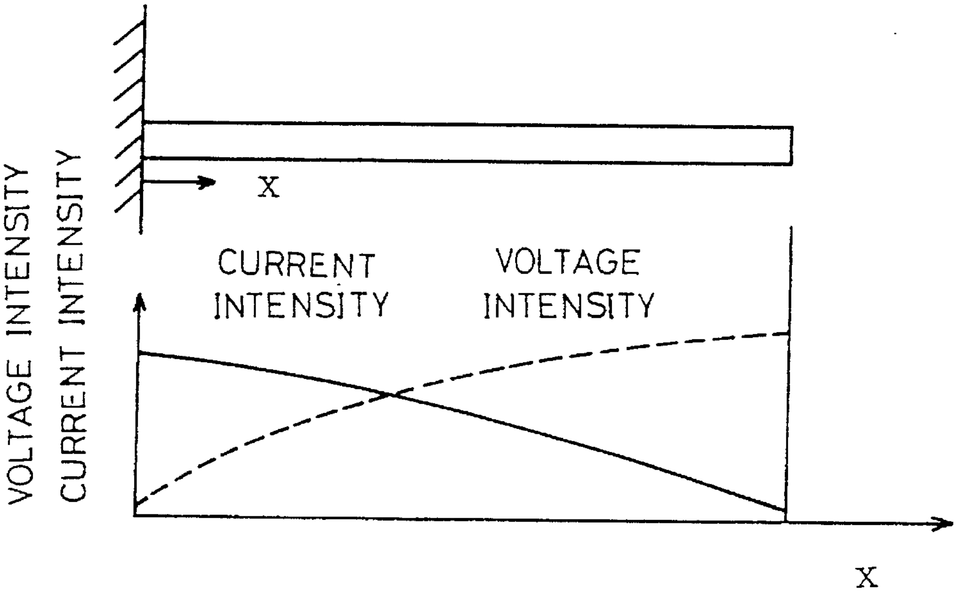
FIG. 11 is an illustrated view showing the electrical current distribution in a microstrip line resonator.

In the resonator 10, the width of the pattern electrode 16 connected to the terminal electrode 34*a* becomes smaller proceeding from one end of it to the other. As shown in FIG. 11, in the microstrip line, the current passing through the end connected to the ground electrode is large, and the current decreases toward the open end. Consequently, by varying the width of the pattern electrode 16, as is done in this resonator 10, resistance corresponding to the current distribution can be obtained, and the Q of the resonator can be increased.

Figure 12:
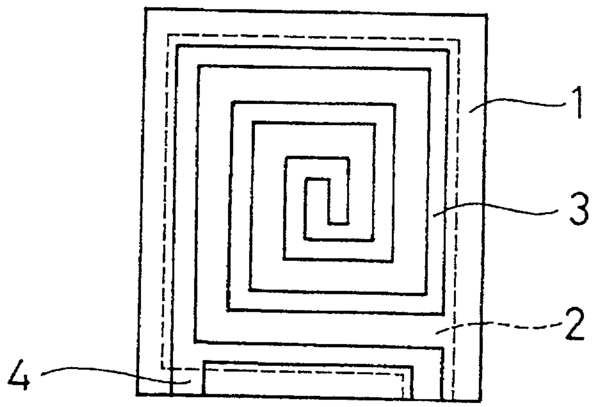
FIG. 12 is an illustrated view showing an existing resonator for the purpose of comparison with the resonator shown in FIG. 1.

As an experimental example, a resonator is formed in which the first dielectric substrate 12 has a dielectric constant of 100, the first dielectric substrate 12 has a thickness of 600 micrometers, the second dielectric substrate 24 has a dielectric constant of 21.5, the second dielectric substrate 24 has a thickness of 600 micrometers, and the pattern electrode 16 has a total length of about 5.0 mm, so that the resonator has a resonant frequency of about 2.4 GHz. The pattern electrode 16 of this resonator is formed so that at distance in the ratios of 0.1:1.9:1.0:2.0 from the ground terminal, it has width in the ratios 2.0:1.5:1.0:0.75. The Q of this resonator is measured to be about 110. As examples for comparison, the Q of a resonator having a uniform pattern electrode width and an resonator having the spiral pattern electrode 3 shown in FIG. 12 are measured. The results are that the resonator having a pattern electrode of uniform width has a Q of about 80, and the resonator shown in FIG. 12 has a Q of about 70. Thus, it is seen that the Q can be increased by about 30% by varying the width of the pattern electrode 16.

Figure 13:
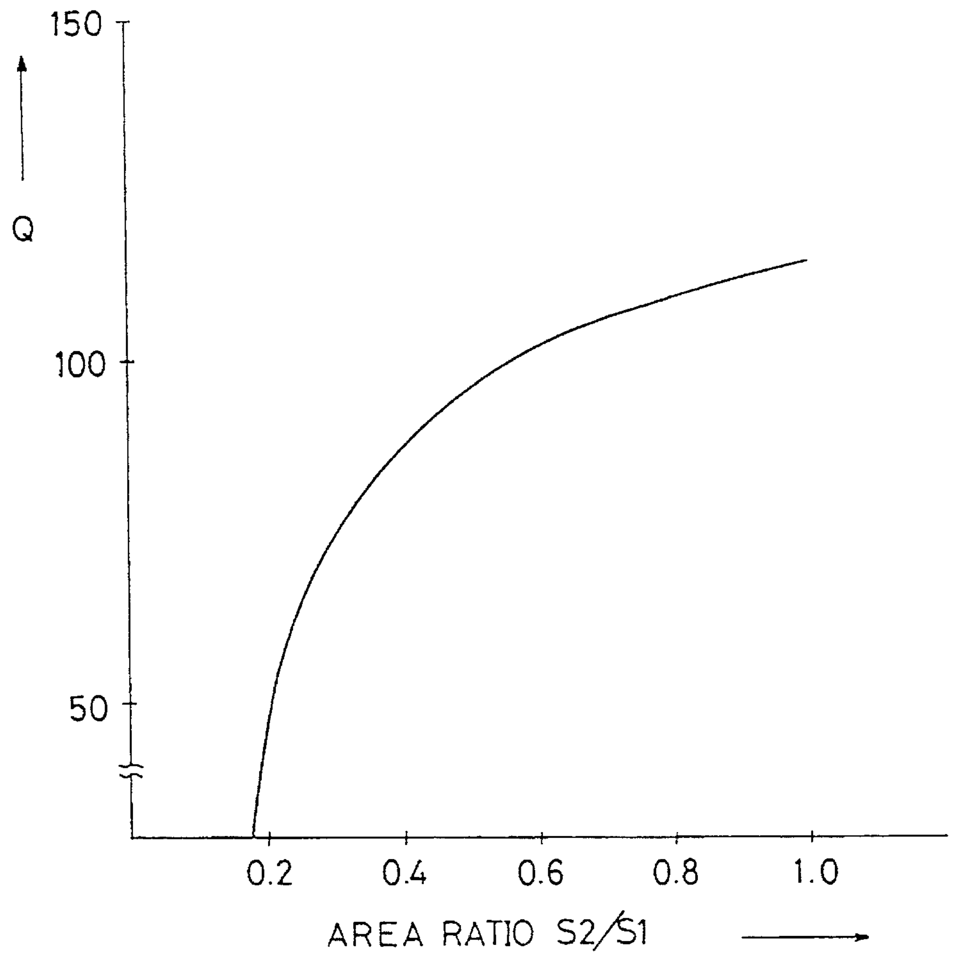
FIG. 13 is a graph showing a relation between the surface ratio S2/S1 of the surface area S2 over which a pattern electrode is not formed to the surface area S1 of the pattern electrode of the resonator shown in FIG. 1, and the Q of the resonator.

In the resonator 10, taking the area of the pattern electrode 16 to be S1, and the area in the middle where the pattern electrode is not formed to be S2, the Q can be increased by increasing the area ratio S2/S1. In the resonator 10, the relation between the area ratio S2/S1 and Q is measured, and it is shown in FIG. 13. As can be seen from FIG. 13, decreasing the area S2 decreases the Q, causing the waveform to deteriorate. Consequently, if the width of the pattern electrode 16 is increased, the capacitance formed between it and the ground electrode 14 can be increased and the resonant frequency can be decreased, making it possible to decrease the size of the resonator, but since the area S2 becomes smaller, it is not desirable to greatly increase the width of the pattern electrode 16 more than is necessary. In addition, the impedance can be adjusted by adjusting the distance between one end of the pattern electrode 16 and the take-out electrode 18, making it possible to easily match the impedance to an external circuit.

In the resonator 10, the guard electrode 20 and the pattern electrode 16 are formed on the same surface of the fist dielectric substrate 12, so that the guard electrode 20 is opposite to the open end of the pattern electrode 16. The guard electrode 20 is connected to the ground electrode 14. If the guard electrode 20 is not formed, since the pattern electrode and the ground electrode are formed on different surfaces, when a dielectric substrate on which many electrodes have been formed is cut, fluctuation would occur in the distances between the open ends of the pattern electrodes and the ground electrodes. This in turn would cause fluctuation in the capacitance formed in this section, causing the resonator characteristics to fluctuate. However, by forming the guard electrode 20 so that it is opposite to the open end of the pattern electrode 16 on the same surface, it is possible to set the distances between these electrodes accurately. Moreover, since the guard electrode 20 is connected to the ground electrode 14, the capacitance that is formed between the pattern electrode 16 and the guard electrode 20, that is to say the capacitance between the pattern electrode 16 and the ground electrode 14, can be fixed. This reduces the fluctuation in the characteristics of the resonator 10.

Figure 14:
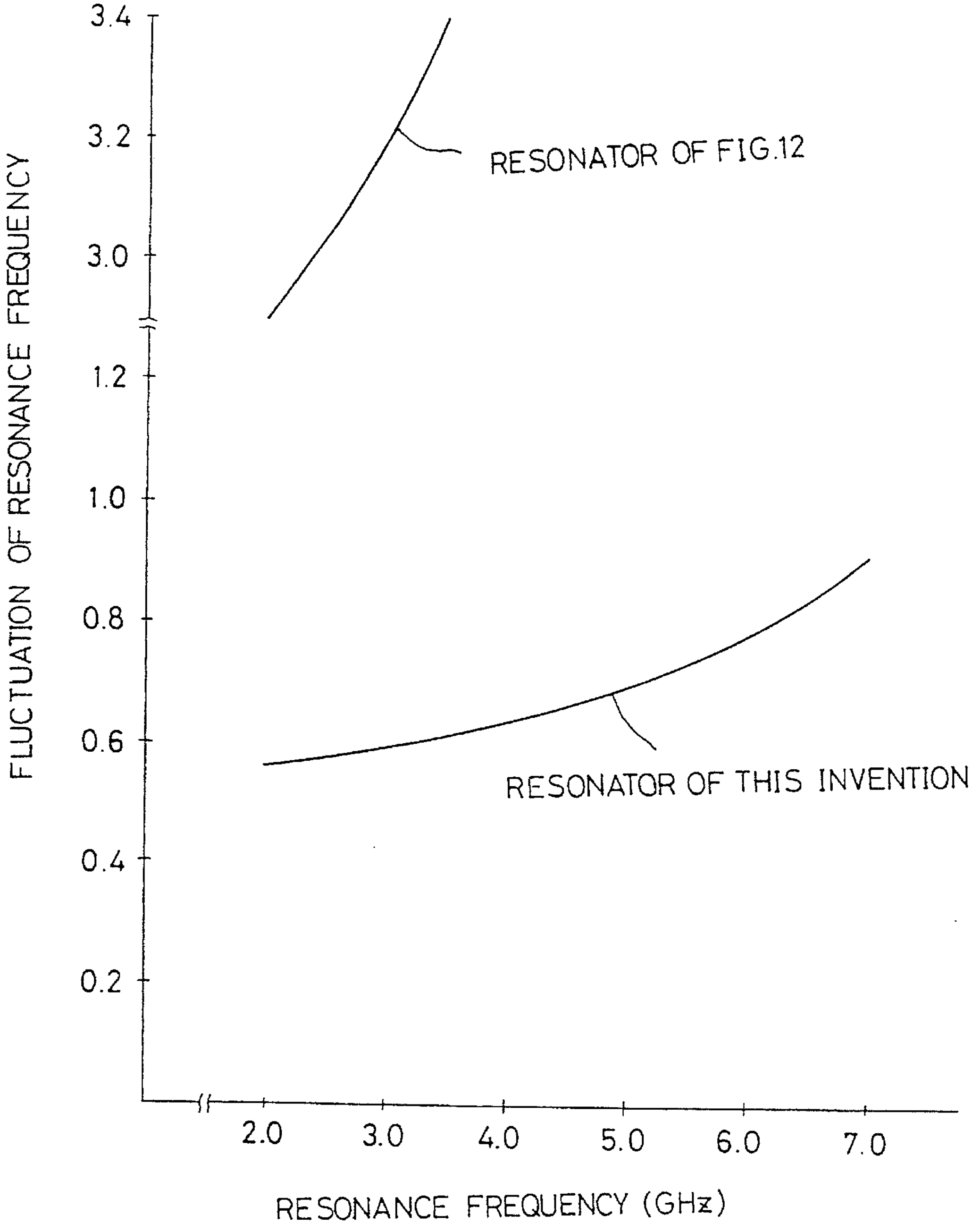
FIG. 14 is a graph showing a relation between the resonant frequencies of the resonator of this invention and an example given for comparison, and its fluctuation.

The relation between the resonant frequencies of the resonator of this invention and an resonator taken as an example for comparison, and their fluctuations, are shown in FIG. 14. The resonator shown in FIG. 12 is used as the example for comparison. As can be seen from FIG. 14, the resonant frequency of the resonator of this invention fluctuates by only about ⅕ as compared with that of the resonator shown in FIG. 12.

Figure 15:
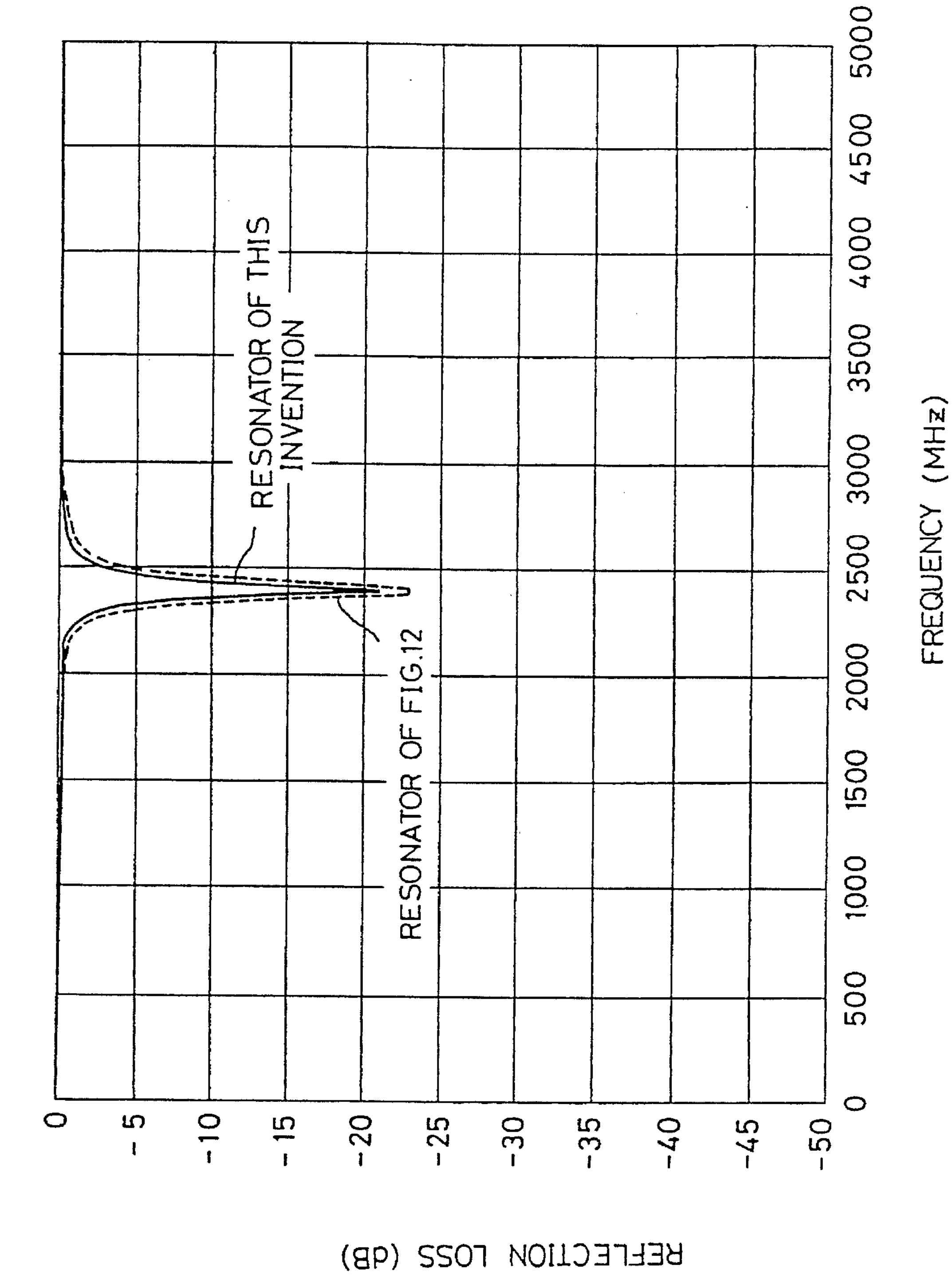
FIG. 15 is a graph showing a frequency characteristic of the resonator shown in FIG. 1 and the resonator shown in FIG. 12.

The frequency characteristics of the resonator of this invention and of the resonator shown in FIG. 12 are shown in FIG. 15. As can be seen from FIG. 15, both of these resonators have a resonant frequency of 2.4 GHz, but when the Q of these resonators are measured, whereas the resonator shown in FIG. 12 has a Q of 70, the resonator of this invention has a Q of 110. Thus, the resonator of this invention has a Q about 1.57 times than that of an existing resonator.

Figure 16:
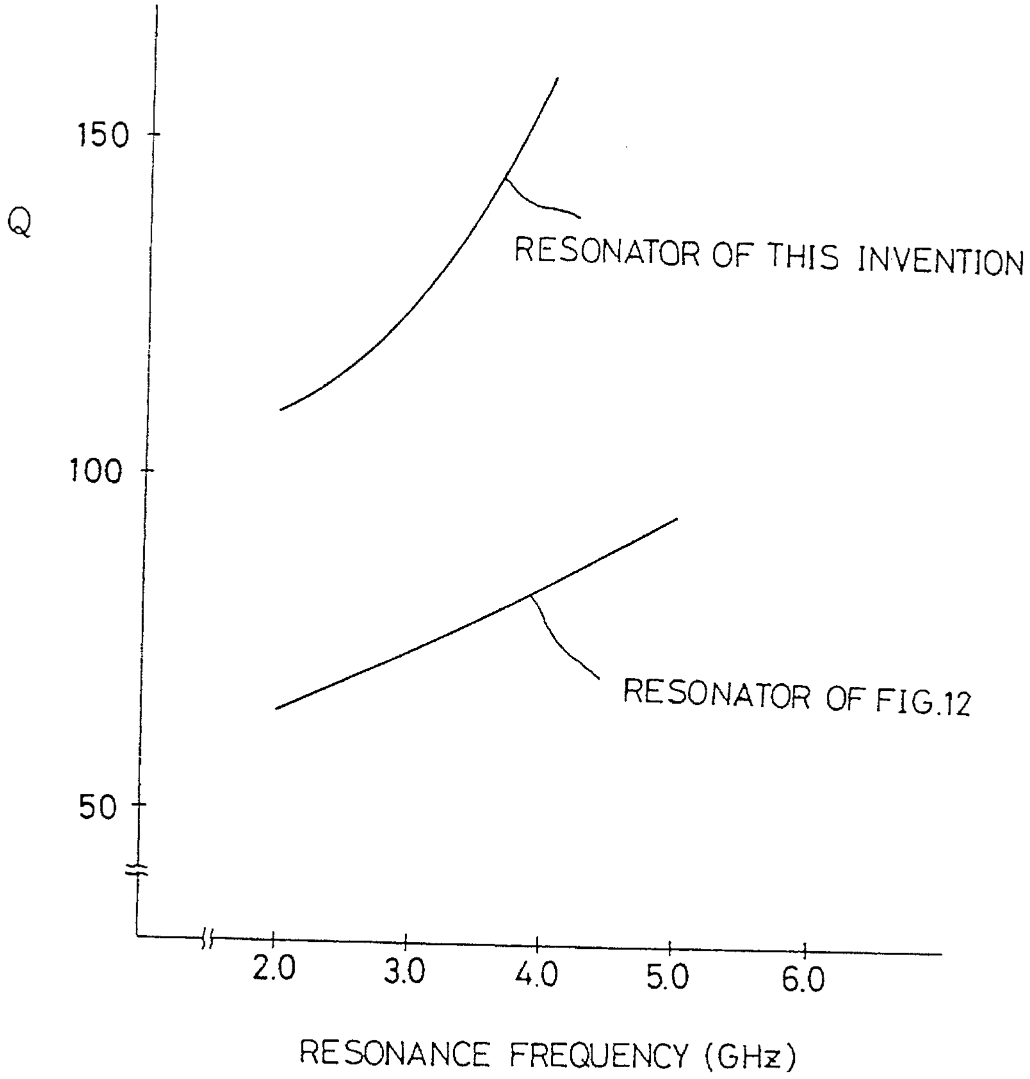
FIG. 16 is a graph showing a relation between the resonant frequencies and the Q of the resonator of this invention and a resonator shown for comparison.

The resonant frequencies of resonators having a different resonant frequency are also measured, and the resonant frequencies and its relation to the Q are shown in FIG. 16. As can be seen from FIG. 16, the Q of the resonator of this invention is higher than that of the resonator in FIG. 12. Thus, this invention is useful in producing a resonator that is both small and has a high Q, and it is possible to obtain a resonator as small as 2.5×1.6 mm.

In the resonator of this invention, the material used for the first dielectric substrate 12 has a dielectric constant of 70 or higher, this is because the smaller the dielectric constant, the longer the total length L of the pattern electrode 16 has to be. As the total length of the pattern electrode 16 increases, the resonator becomes larger. Consequently, in order to obtain a small resonator, it is desirable for a material having a dielectric constant of 70 or higher to be used as the first dielectric substrate 12.

The impedance of the resonator can be adjusted by changing the location where the take-out electrode drawn out from the pattern electrode is formed, making it possible to match the impedance to an external circuit. This makes it unnecessary to use other LC components to match the impedances. Moreover, by using a method such as etching, the various electrodes can be formed to accurate dimensions, making it possible to obtain a highly accurate resonator. For example, whereas the accuracy of an electrode formed by thick film printing or plating is ±10 to 20 micrometers, the accuracy in the resonator of this invention is ±2 micrometers. In addition, since a plurality of electrode patterns can be formed accurately on one dielectric substrate sheet, mass production of the resonator becomes possible, and the manufacturing cost can be reduced.

Figure 17:
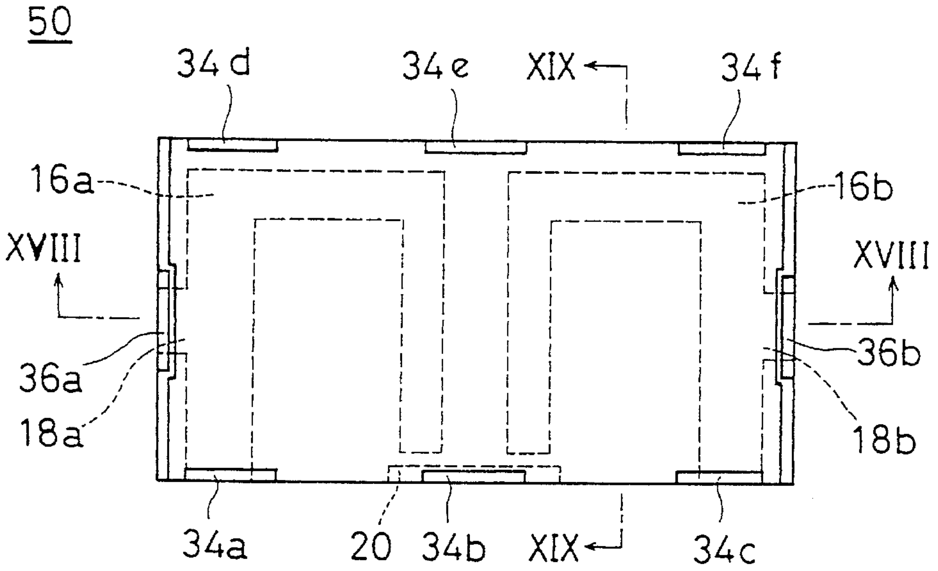
FIG. 17 is a plan view showing one example of a chip-type filter of this invention.
Figure 18:
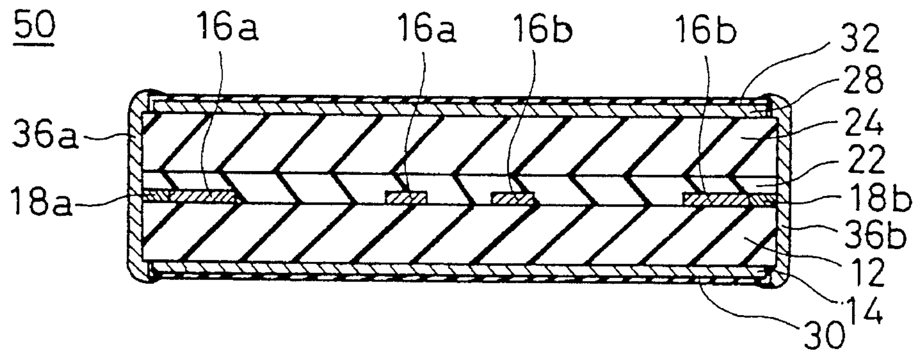
FIG. 18 is a cross-sectional view along the line XVIII—XVIII through the chip-type filter shown in FIG. 17.
Figure 19:
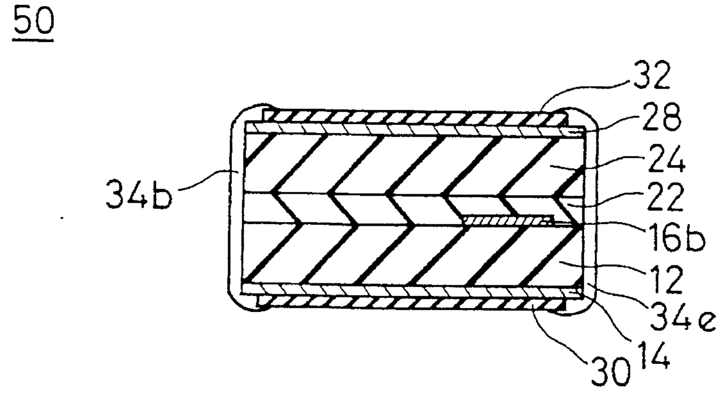
FIG. 19 is a cross-sectional view along the line XIX—XIX through the chip-type filter shown in FIG. 17.
Figure 20:
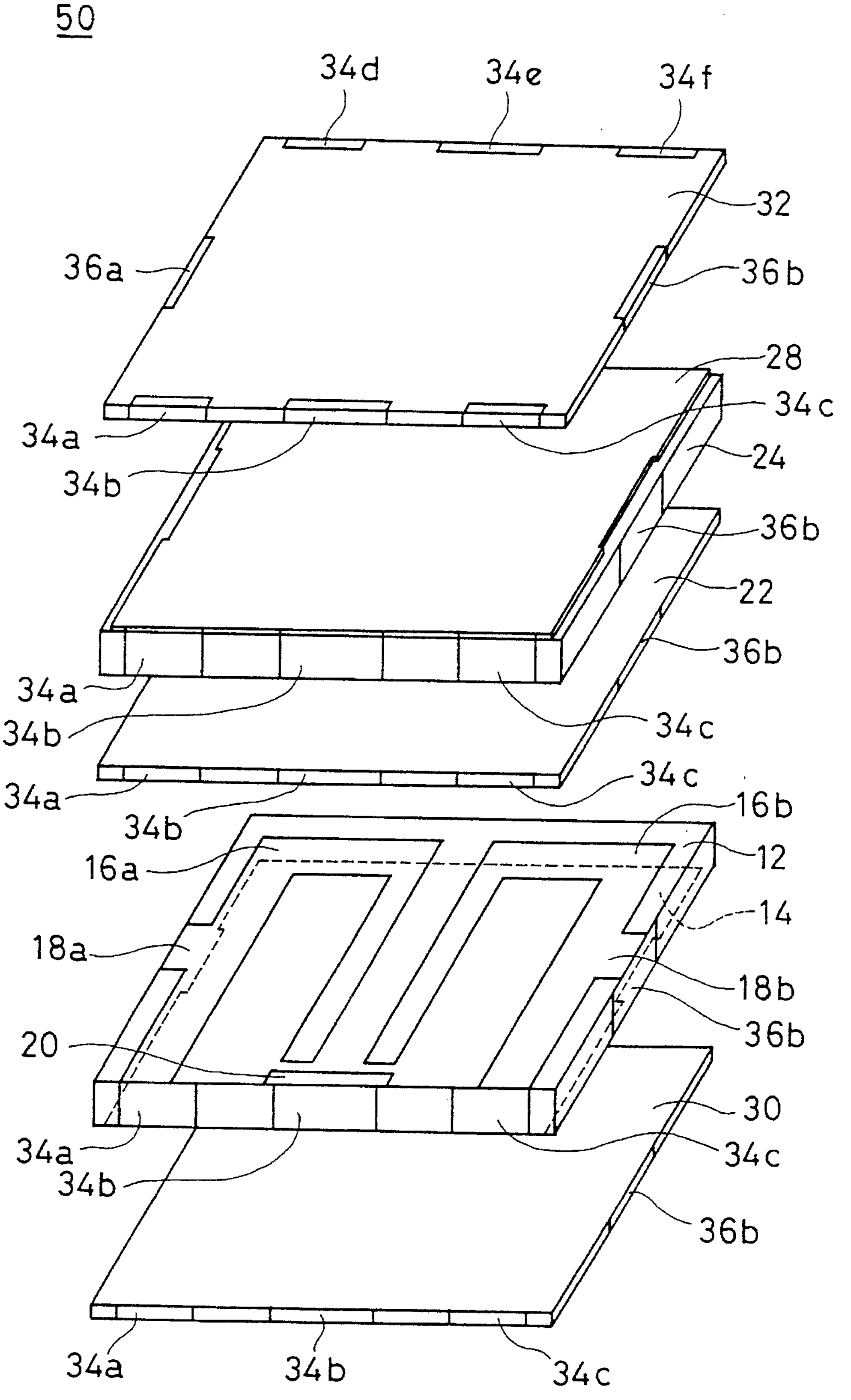
FIG. 20 is an exploded perspective view of the chip-type filter shown in FIG. 17.
Figure 21:
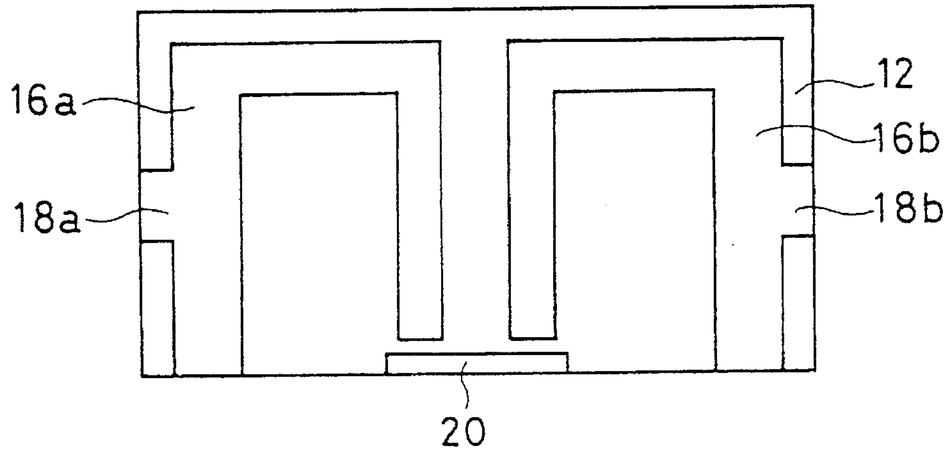
FIG. 21 is a plan view showing a first dielectric substrate of the chip-type filter shown in FIG. 17.
Figure 22:
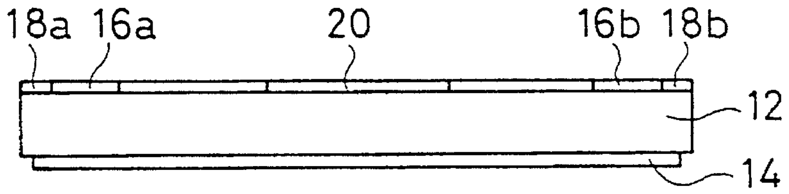
FIG. 22 is a side view of the first dielectric substrate shown in FIG. 21.
Figure 23:
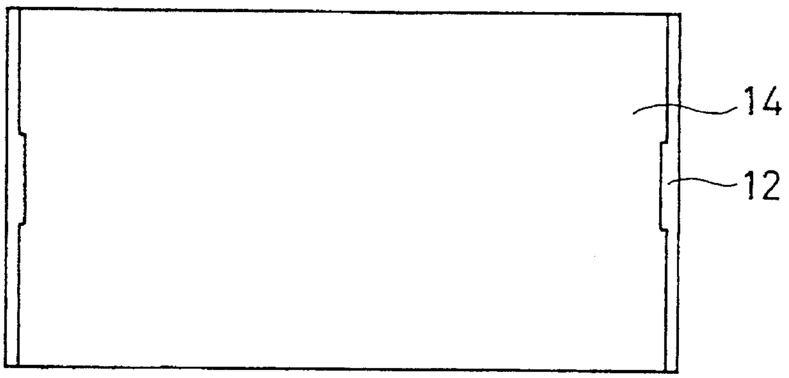
FIG. 23 is a rear view of the first dielectric substrate shown in FIG. 21.

A filter can be formed by using this type of resonator. FIG. 17 is a plan view showing such a chip-type filter. FIG. 18 and FIG. 19 are cross-sectional views along lines XVIII—XVIII and XIX—XIX respectively, and FIG. 20 is an exploded perspective view. The chip-type filter 50 includes a rectangular sheet-shaped first dielectric substrate 12. As shown in FIG. 21, FIG. 22 and FIG. 23, a ground electrode 14 is formed covering almost all of one surface of the first dielectric substrate 12. Two pattern electrodes 16*a* and 16*b* are formed on the other surface of the first dielectric substrate 12 so that they are opposite to the ground electrode 14.

The pattern electrode 16*a* is formed in a U-shape at one side portion of the first dielectric substrate 12 facing from one edge toward the inside. The other pattern electrode 16*b* is formed in a U-shape at the other side portion of the first dielectric substrate 12 facing from the same edge that the pattern electrode 16*a* is faced toward the inside. These pattern electrodes 16*a* and 16*b* are formed so that their widths become smaller moving from the edge toward the interior of the first dielectric substrate 12.

A take-out electrode 18*a* is drawn out from the pattern electrode 16*a* toward the edge of the first dielectric substrate 12. The take-out electrode 18*a* is formed so that it is at a certain distance from one end of the pattern electrode 16*a* which is drawn out to the edge of the first dielectric substrate 12. Similarly, a take-out electrode 18*b* is drawn out from the pattern electrode 16*b* toward the edge of the first dielectric substrate 12. The take-out electrode 18*b* is formed so that it is at a certain distance from one end of the pattern electrode 16*b* which is drawn out to the edge of the first dielectric substrate 12.

Figure 24:
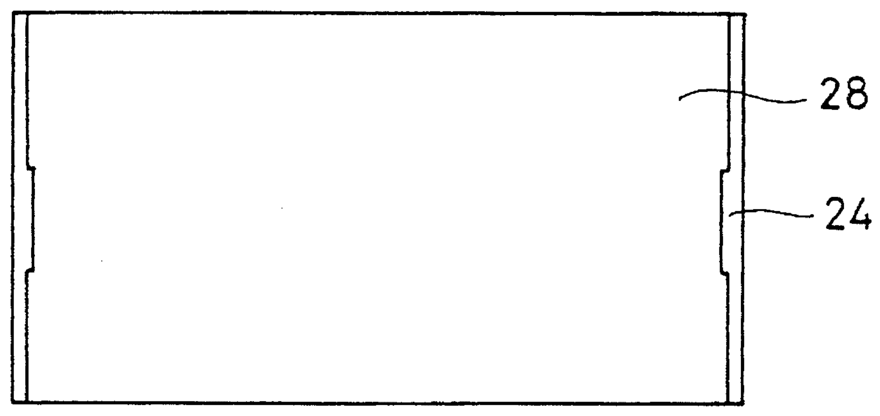
FIG. 24 is a plan view showing a second dielectric substrate of the chip-type filter shown in FIG. 17.
Figure 25:
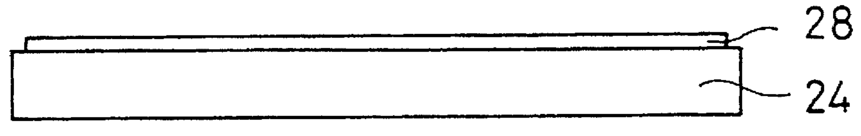
FIG. 25 is a side view of the second dielectric substrate shown in FIG. 24.
Figure 26:
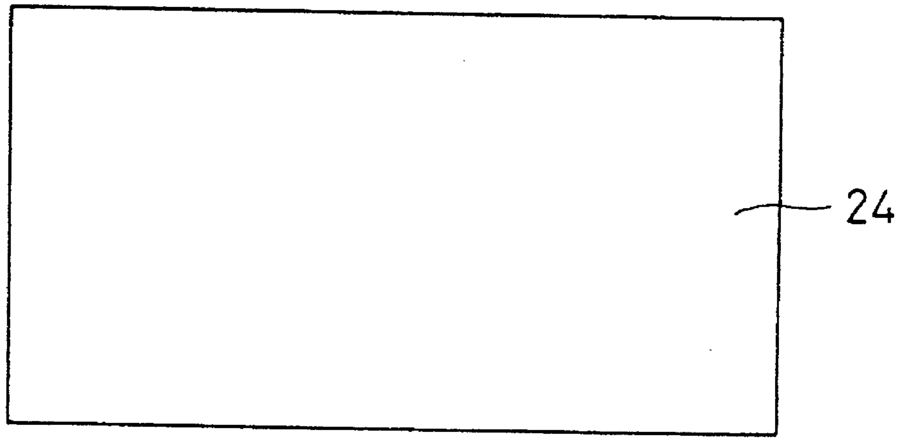
FIG. 26 is a rear view of the second dielectric substrate shown in FIG. 24.

A guard electrode 20 is formed on the other surface of the first dielectric substrate 12 so that it is opposite to the inner ends of the pattern electrodes 16*a* and 16*b*. The guard electrode 20 is drawn out to the edge of the first dielectric substrate 12. An adhesive layer 22 of polyimide and the like is formed on these pattern electrodes 16*a*, 16*b*, take-out electrodes 18*a*, 18*b* and guard electrode 20. A second dielectric substrate 24 is formed on the adhesive layer 22. A shield electrode 28 is formed on the second dielectric substrate 24 so as to cover almost all surface of the second dielectric substrate 24 as shown in FIG. 24, FIG. 25 and FIG. 26. Then, protective layers 30 and 32 are formed so as to cover the ground electrode 14 and the shield electrode 28. At this time, the protective layers 30 and 32 are formed so that the edges of the ground electrode 14 and the shield electrode 28 are exposed except in the directions in which the take-out electrodes 18*a* and 18*b* are drawn out.

On the opposite sides of the chip-type filter 10, six terminal electrodes 34*a*, 34*b*, 34*c*, 34*d*, 34*e* and 34*f* are formed. These terminal electrodes 34*a*–34*f* are formed on the sides on which the take-out electrodes 18*a* and 18*b* are not drawn out. The pattern electrode 16*a*, the ground electrode 14 and the shield electrode 28 are connected by the terminal electrode 34*a*. Similarly, the pattern electrode 16*b*, the ground electrode 14 and the shield electrode 28 are connected by the terminal electrode 34*c*. The guard electrode 20, the ground electrode 14 and the shield electrode 28 are connected by the terminal electrode 34*b*. The other terminal electrodes 34*d*, 34*e* and 34*f* are connected to the ground electrode 14 and the shield electrode 28.

A take-out terminal electrode 36*a* is formed on the side of the chip-type filter 10 along which the take-out electrode 18*a* is drawn out, and the take-out terminal electrode 36*b* is formed on the side along which the take-out electrode 18*b* is drawn out. The take-out terminal electrode 36*a* is connected to the take-out electrode 18*a*, and the take-out terminal electrode 36*b* is connected to the take-out electrode 18*b*. The input and output impedance of the chip-type filter 10 are determined by the distance between the end of the pattern electrode 16*a* connected to the terminal electrode 34*a* and the take-out electrode 18*a*, and the distance between the end of the pattern electrode 16*b* connected to the terminal electrode 34*c* and the take-out electrode 18*b*.

Figure 27:
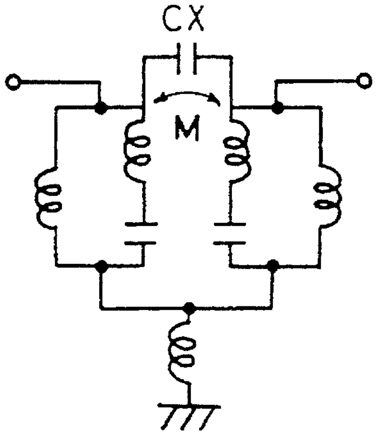
FIG. 27 is an equivalent circuit diagram of the chip-type filter shown in FIG. 17.
Figure 28:
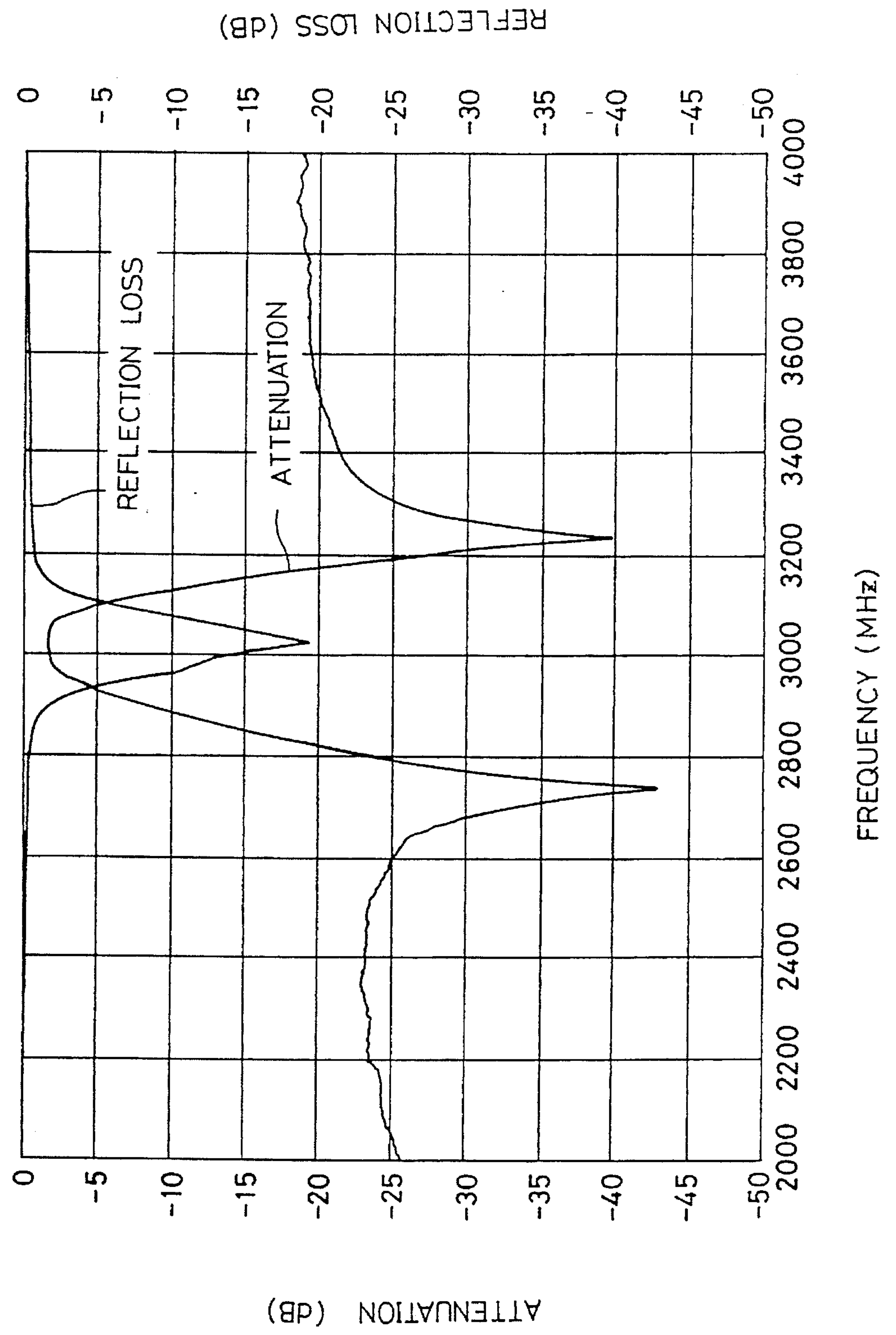
FIG. 28 is a graph showing a frequency characteristic of the chip-type filter shown in FIG. 17.

In the chip-type filter 10, as in the case of the resonator described above, a capacitor pattern is not formed, but the filter has an equivalent circuit shown in FIG. 27. In the equivalent circuit shown in FIG. 27, CX and M show the electromagnetic coupling. In the chip-type filter 50, the filter is formed by the electromagnetic coupling of two resonators. The chip-type filter 50 is formed with a material having a dielectric constant of 100 for the first dielectric substrate 12 and a material having a dielectric constant of 20 for the second dielectric substrate 24. Its frequency characteristic is shown in FIG. 28. Also in this chip-type filter 50, a filter with a large Q can be obtained by increasing the area ratio S2/S1 and varying the widths of the pattern electrodes 16*a* and 16*b*.

Figure 29:
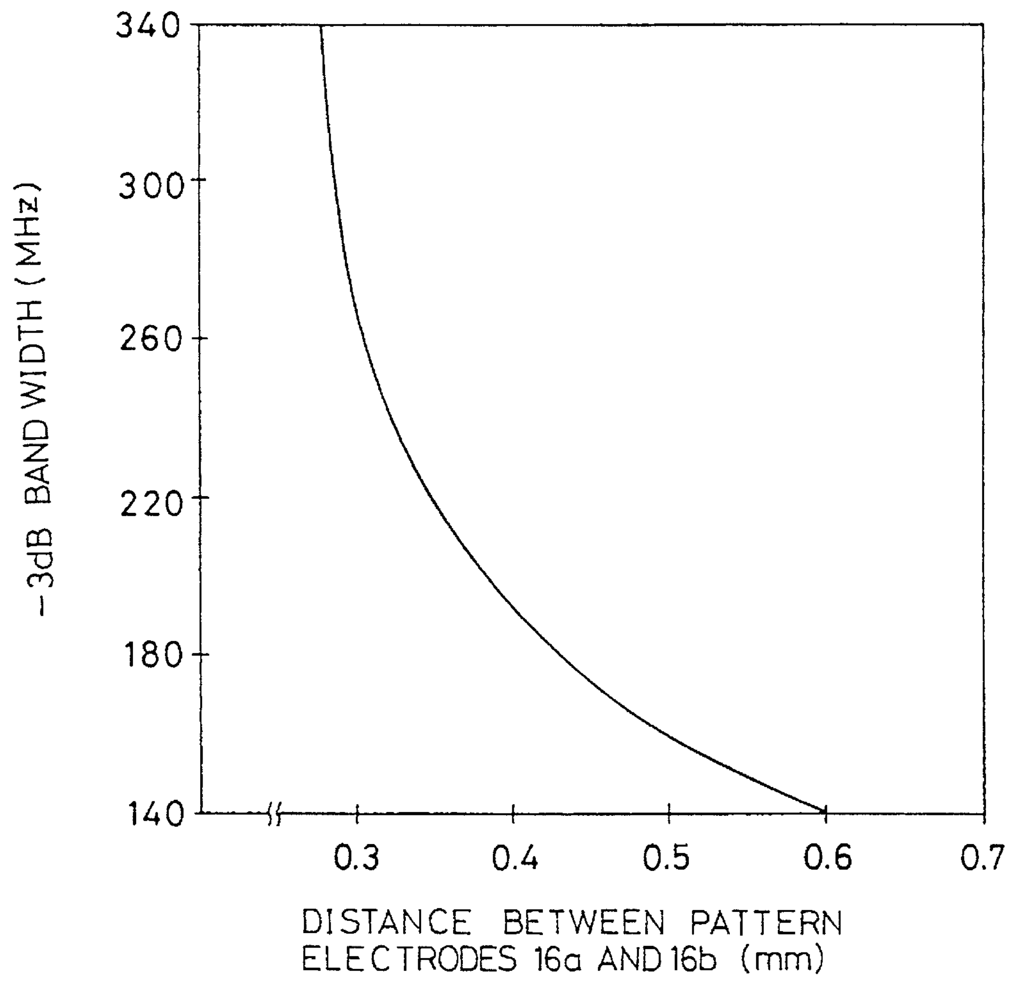
FIG. 29 is a graph showing a relation between the distance between the pattern electrodes of the chip-type filter shown in FIG. 17 and the −3 dB band width.

The frequency band width of the chip-type filter 50 can be adjusted by varying the distance between the two pattern electrodes 16*a* and 16*b*. In this type of chip-type filter 50, the distance between the pattern electrodes 16*a* and 16*b* is varied, and the −3 dB band widths are measured. The results are shown in FIG. 29. As can be seen from FIG. 29, when the distance between the pattern electrodes is decreased, the band width becomes wider, and when the distance between the pattern electrodes is increased, the band width becomes narrower. However, it is not desirable to decrease the distance between the pattern electrodes more than necessary, because then a bimodal response will be produced.

In the chip-type filter 50, the input and output impedances can be adjusted by adjusting the distance between one end of the pattern electrode 16*a* and the take-out electrode 18*a*, and between one end of the pattern electrode 16*b* and the take-out electrode 18*b*, making it possible to easily match the impedances to external circuits.

Also, in the chip-type filter 50, since the pattern electrodes 16*a* and 16*b* have U-shape, the chip-type filter 50 can be made smaller than filters with linear pattern electrodes. The sections of the two pattern electrodes that are in close proximity to each other are also shorter than in a filter with linear pattern electrodes. For this reason, the electromagnetic coupling of the two resonators is relatively weak, so the distance between the two pattern electrodes can be reduced. Consequently, the chip-type filter can be made smaller. As such chip-type filter, a small band pass filter having a size of 3.2×1.6 mm can be obtained.

In the chip-type filter 50, the guard electrode 20 is formed so that it is opposite to the open ends of the pattern electrodes 16*a* and 16*b* on the same surface of the first dielectric substrate 12, so even if a dielectric substrate on which many electrodes have been formed is cut, the distances between the open ends of the pattern electrodes 16*a*, 16*b* and the guard electrode 20 are fixed. The guard electrode 20 is connected to the ground electrode 14, so the fluctuation in the capacitances formed between the open ends of the pattern electrodes 16*a*, 16*b* and the guard electrode 20 is small. Consequently, there is little fluctuation in the characteristics of the chip-type filter 50.

The input and output impedances of the chip-type filter can be adjusted by varying the positions where the take-out electrodes drawn out from the pattern electrodes are formed. Moreover, by using a method such as etching, the electrodes can be formed with accurate dimensions, so that a highly accurate chip-type filter is obtained. In an experiment, the fluctuation of the center frequency of the chip-type filter can be less than ±1.0%. In addition, many electrode patterns can be accurately formed on one dielectric substrate sheet, so that the chip-type filters can be mass produced, and the manufacturing cost can be reduced.

Figure 30:
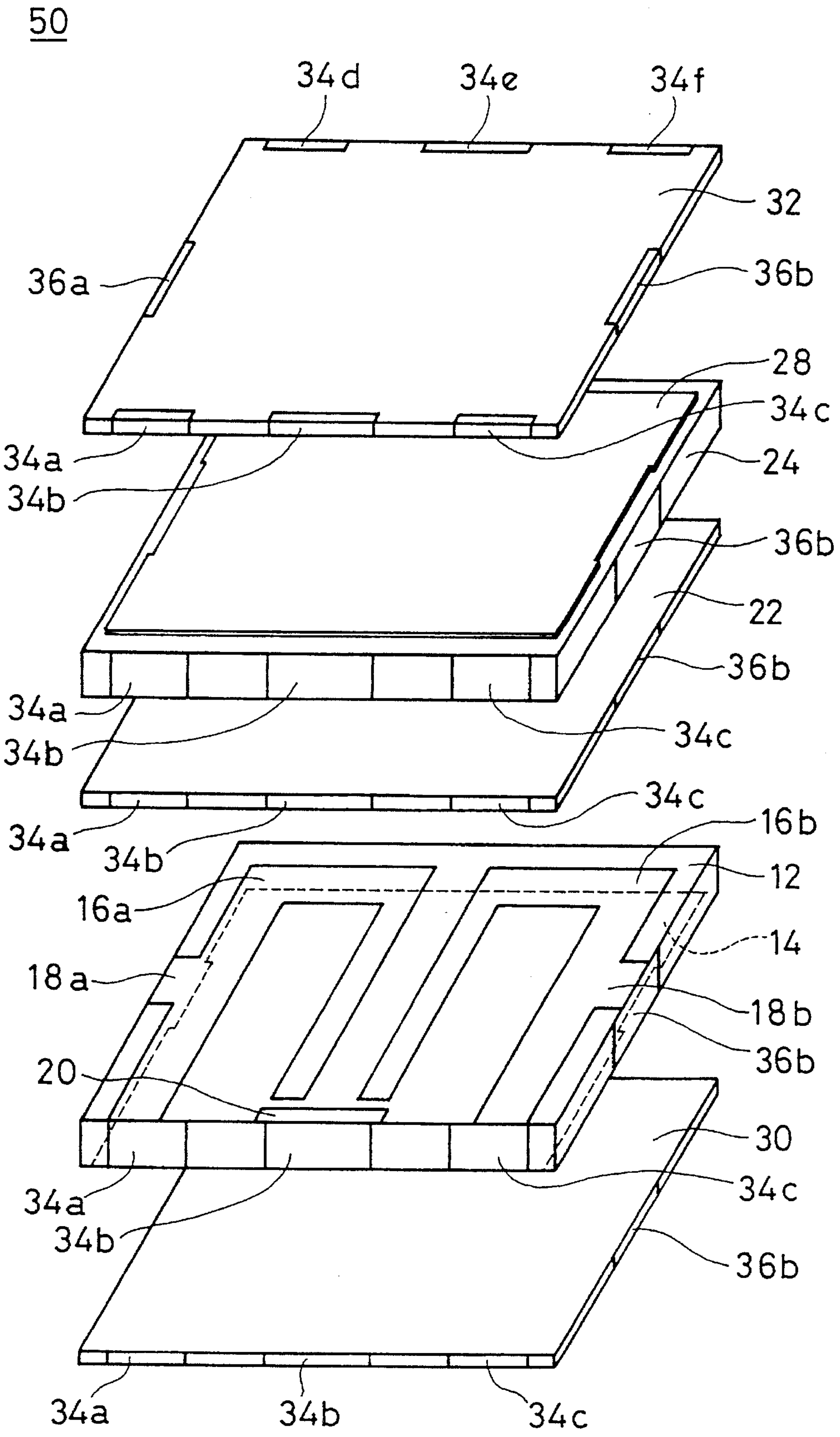
FIG. 30 is an exploded perspective view showing another embodiment of the chip-type filter of this invention.

As shown in FIG. 30, the shield electrode 28 may be made smaller than the protective layer 32, insulating it from the other electrodes. When the shield electrode 28 is connected to the ground electrode 14, the capacitances formed between the pattern electrodes 16*a*, 16*b* and the shield electrode 28 are grounded, reducing the electrical coupling between the pattern electrodes 16*a* and 16*b*, which sometimes causes the characteristics to deteriorate. However, if the shield electrode 28 is insulated from the other electrodes, then the capacitances formed between the pattern electrodes 16*a*, 16*b* and the shield electrode 28 are no grounded. Consequently, it is possible to obtain adequate electrical coupling between the pattern electrodes 16*a* and 16*b*, and thus a chip-type filter having superior characteristics can be obtained.

Figure 31:
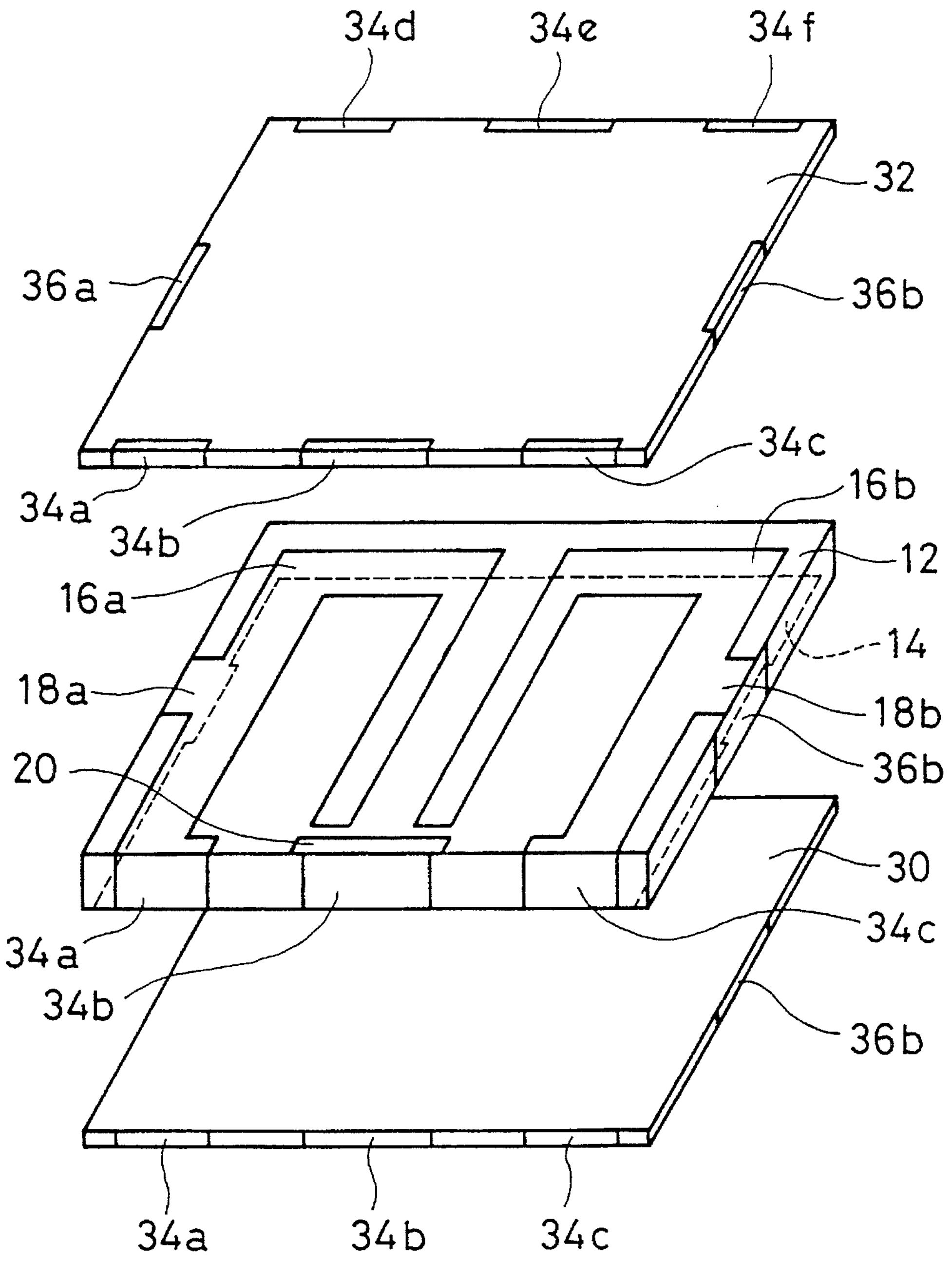
FIG. 31 is an exploded perspective view showing still another embodiment of the chip-type filter of this invention.

The shield electrode may not be formed at all, as shown in FIG. 31. In this case, a protective layer 32 is formed on the pattern electrodes 16*a* , 16*b*, the take-out electrodes 18*a*, 18*b* and the guard electrode 20. In a filter in which a shield electrode is formed, the magnetic field between the two resonators is obstructed by the shield electrode, which in some cases reduces the magnetic coupling between the resonators. In such a case, there is a danger that the characteristics of the chip-type filter will deteriorate. However, in this chip-type filter 50, a shield electrode is not formed, so that the magnetic field between the resonators is not obstructed, and adequate magnetic coupling can be obtained. Consequently, a chip-type filter having superior characteristics can be obtained. Comparing a filter having a −3 dB band width of 200 MHz and center frequency of 3.2 GHz with one that has a shield electrode, the insertion loss can be reduced about 0.2–0.5 dB.

Figure 32:
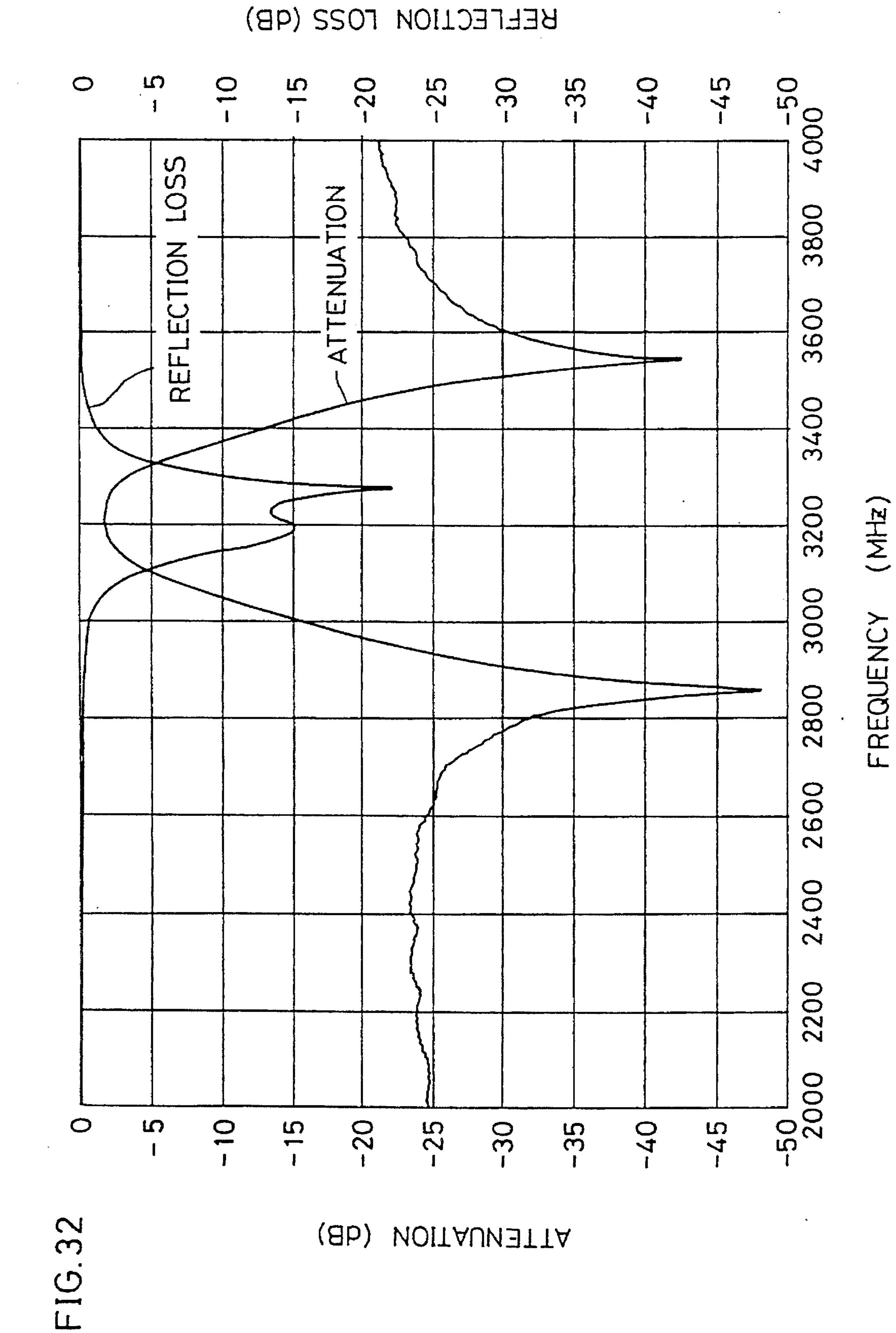
FIG. 32 is a graph showing a frequency characteristic of the chip-type filter shown in FIG. 31.
Figure 33:
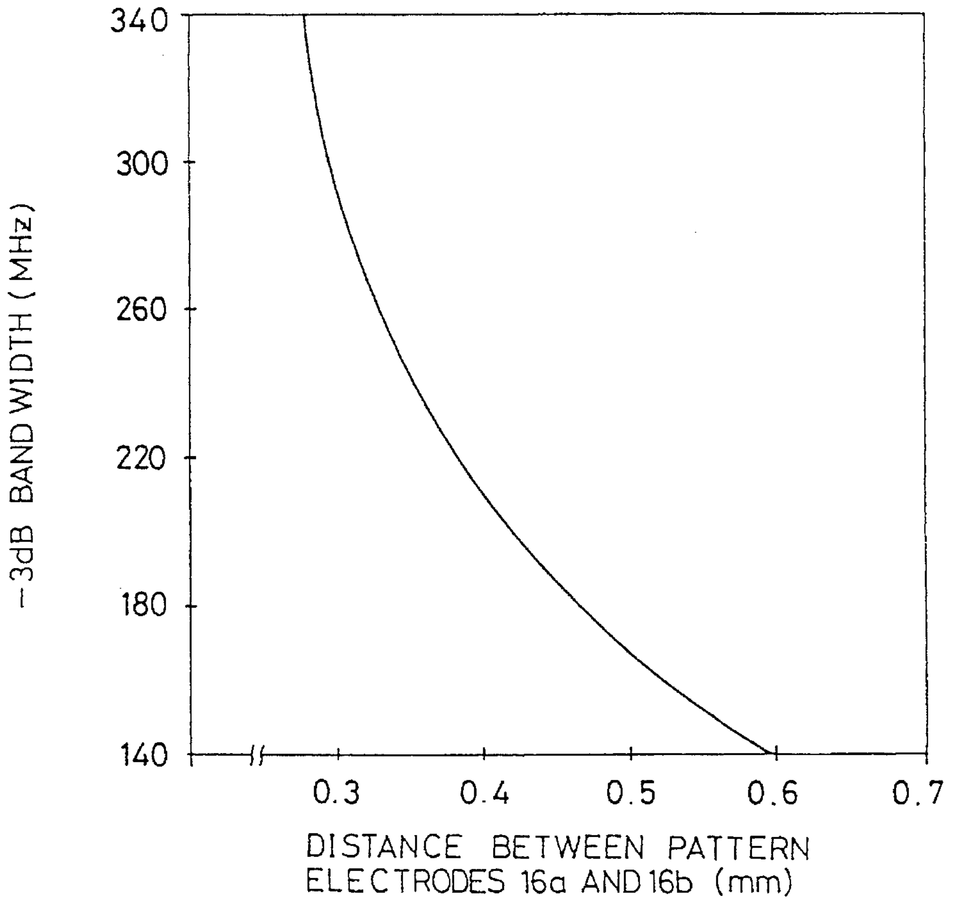
FIG. 33 is a graph showing a relation between the distance between the pattern electrodes in the chip-type filter shown in FIG. 31 and the −3 dB band width.

The frequency characteristics of the chip-type filter 50 are shown in FIG. 32. The relation between the distance between the two pattern electrodes 16*a*, 16*b* and the −3 dB band width is shown in FIG. 33. As shown in FIG. 32, it is possible to obtain such a chip-type filter 50 with a high Q. As shown in FIG. 33, the band width can be increased by decreasing the distance between the pattern electrodes 16*a* and 16*b*, but the distance should not be decreased more than necessary because the frequency response will become bimodal.

In this chip-type filter 50, all of the electrodes can be formed on one dielectric substrate, the amount of structural fluctuation can be obtained. In addition, since the construction is simple, this chip-type filter can be manufactured at low cost.

Even in a chip-type filter in which the shield electrode is insulated or not formed at all, by forming the guard electrode 20, the capacitances between the pattern electrodes 16*a*, 16*b* and the guard electrode 20 can be fixed, so that filters with little fluctuation in characteristics can be obtained.

Figure 34:
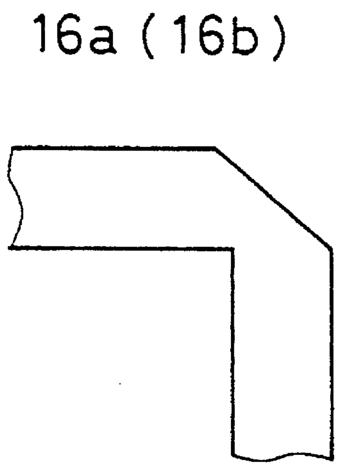
FIG. 34 is an illustrated view showing a modified example of a bent pattern electrode.
Figure 35:
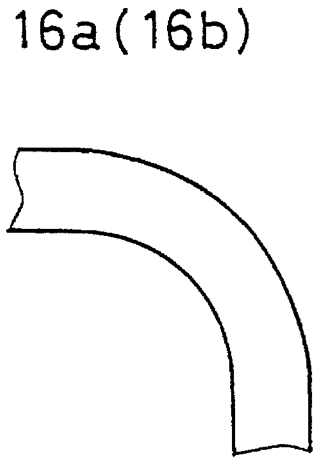
FIG. 35 is an illustrated view showing a still modified example of a bent pattern electrode.
Figure 36:
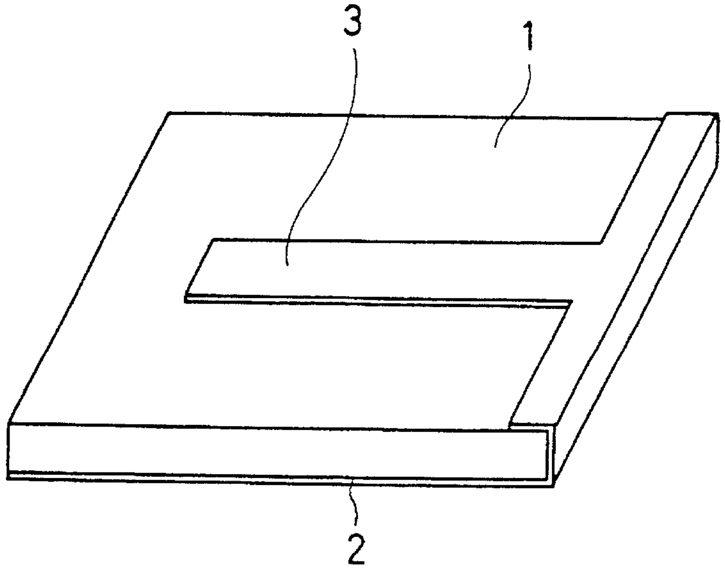
FIG. 36 PRIOR ART
FIG. 36 is an illustrated view showing an existing resonator that forms the background to this invention.
Figure 37:
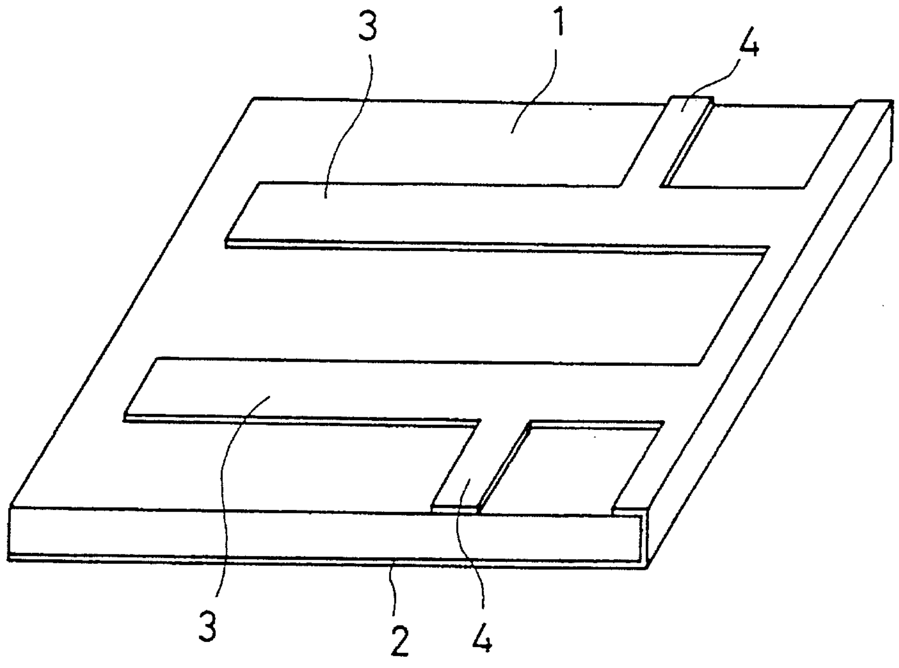
FIG. 37 PRIOR ART
FIG. 37 is an illustrated view showing an existing filter that is also part of the background of this invention.

In the embodiments described above, the pattern electrodes are formed with varying width and the area ratio S2/S1 becomes large, but even in a chip-type filter having uniform pattern electrode width and small area ratio S2/S1, by forming the guard electrode, chip-type filters with little fluctuation in characteristics can be obtained. The pattern electrodes can be formed in another shape such as a straight line, by forming the guard electrode so that it is opposite to the open ends, chip-type filters having little fluctuation in characteristics can be obtained. In addition, the pattern electrodes can be formed with bends, such as shown in FIG. 34 and FIG. 35, to reduce radiative loss and reflective loss in the high frequency region. In FIG. 34, the outer circumference side of the bent portion of the pattern electrode is formed at a diagonal, in FIG. 35, the bent part of the pattern electrode is formed in a curved shape.

This invention has been explained in detail with the aid of drawings, but these are merely schematic explanations and explanations of one example, it should be clear that they are not to be interpreted as limiting the scope of application of this invention. The spirit and scope of this invention are limited only by the attached text of the claims.

What is claimed is:

1. A resonator comprising;

a dielectric substrate, a ground electrode formed in a planar shape on one surface of said dielectric substrate, a pattern electrode formed on the other surface of said dielectric substrate so as to be opposite to said ground electrode, such that one end of it is connected to said ground electrode, a take-out electrode drawn out from said pattern electrode at a certain distance from one end of said pattern electrode, and a guard electrode formed on the other surface of said dielectric substrate at a position opposite to the other end of said pattern electrode, and connected to said ground electrode.

2. A resonator in accordance with claim 1, further comprising said pattern electrode which is formed in a U-shape.

3. A resonator in accordance with claim 2, wherein a shield electrode is formed so that it is opposite to said pattern electrode, said take-out electrode and said guard electrode with another dielectric substrate between these electrodes and said shield electrode.

4. A chip-type filter comprising;

an dielectric substrate, a ground electrode formed in a planar shape on one surface of said dielectric substrate, a plurality of pattern electrodes formed on the other surface of said dielectric substrate so as to be opposite to said ground electrode, such that one end of each is connected to said ground electrode, take-out electrodes formed respectively at a certain distance from one end of each of said pattern electrodes and drawn out from said pattern electrodes, and a guard electrode formed on the other surface of said dielectric substrate at a position where it is opposite to the other ends of the respective said pattern electrodes, and connected to said ground electrode, wherein the plurality of said pattern electrodes are electromagnetically coupled.

5. A chip-type filter in accordance with claim 4, wherein each of said pattern electrodes is formed in a U-shape.

6. A chip-type filter in accordance with claim 5, which further comprises protective layers formed on said ground electrode and on said pattern electrodes, said take-out electrodes and said guard electrode.

7. A chip-type filter in accordance with claim 5, further comprising a shield electrode which is formed so that it is opposite to said pattern electrodes, said take-out electrodes and said guard electrode with another dielectric substrate between these electrodes and said shield electrode.

8. A chip-type filter in accordance with claim 7, wherein said shield electrode is insulated from the other electrodes.

9. A resonator comprising:

a first dielectric substrate, a ground electrode formed in a planar shape on one surface of said dielectric substrate, a pattern electrode formed on the other opposite surface of said dielectric substrate so as to be opposite to said ground electrode, such that one end of the pattern electrode is connected to said ground electrode, a take-out electrode drawn out from said pattern electrode at a certain distance from one end of said pattern electrode, a guard electrode formed on the other surface of said dielectric substrate at a position opposite to the other end of said pattern electrode, and connected to said ground electrode, an adhesive layer formed on said pattern electrode, said take-out electrode and said guard electrode, a second dielectric substrate formed on said adhesive layer, and having a lower dielectric constant than said first dielectric substrate, and a shield electrode formed in a planar shape on said second dielectric substrate.

10. A chip-type filter comprising:

a first dielectric substrate, a ground electrode formed in a planar shape on one surface of said dielectric substrate, a plurality of pattern electrodes formed on the other opposite surface of said dielectric substrate so as to be opposite to said ground electrode, such that one end of each pattern electrode is connected to said ground electrode, take-out electrodes formed respectively at a certain distance from one end of each of said pattern electrodes and drawn out from said pattern electrodes, a guard electrode formed on the other surface of said dielectric substrate at a position where it is opposite to the other ends of the respective said pattern electrodes, and connected to said ground electrode, an adhesive layer formed on said pattern electrodes, said take-out electrodes and said guard electrode, a second dielectric substrate formed on said adhesive layer, and having a lower dielectric constant than said first dielectric substrate, and a shield electrode formed in a planar shape on said second dielectric substrate, wherein a plurality of said pattern electrodes are electromagnetically coupled.

* * * * *